(12) United States Patent
Hall et al.

(10) Patent No.: US 8,498,125 B2
(45) Date of Patent: Jul. 30, 2013

(54) INSTRUMENTATION PACKAGE IN A DOWNHOLE TOOL STRING COMPONENT

(75) Inventors: David R. Hall, Provo, UT (US); Jim Shumway, Lehi, UT (US)

(73) Assignee: Schlumberger Technology Corporation, Houston, TX (US)

( * ) Notice: Subject to any disclaimer, the term of this patent is extended or adjusted under 35 U.S.C. 154(b) by 795 days.

(21) Appl. No.: 12/135,556

(22) Filed: Jun. 9, 2008

(65) Prior Publication Data

US 2009/0303686 A1    Dec. 10, 2009

(51) Int. Cl.
*H05K 1/00* (2006.01)

(52) U.S. Cl.
USPC ........... 361/749; 361/735; 361/783; 361/803; 361/790

(58) Field of Classification Search
USPC ............... 361/749, 735, 783, 803, 790
See application file for complete search history.

(56) References Cited

U.S. PATENT DOCUMENTS

| | | | | |
|---|---|---|---|---|
| 3,383,565 A | * | 5/1968 | Gritton | 361/784 |
| 5,448,227 A | * | 9/1995 | Orban et al. | 340/854.4 |
| 5,708,568 A | * | 1/1998 | Ostendorf | 361/749 |
| 5,786,986 A | * | 7/1998 | Bregman et al. | 361/719 |
| 5,841,638 A | * | 11/1998 | Purdom et al. | 361/790 |
| 5,931,000 A | * | 8/1999 | Turner et al. | 62/3.2 |
| 5,999,414 A | * | 12/1999 | Baker et al. | 361/789 |
| 6,225,688 B1 | | 5/2001 | Kim | |
| 6,717,250 B1 | | 4/2004 | Emoto | |
| 6,778,389 B1 | * | 8/2004 | Glovatsky et al. | 361/690 |
| 7,071,547 B2 | | 7/2006 | Kang | |
| 7,158,384 B2 | | 1/2007 | Huang | |
| 7,167,373 B1 | | 1/2007 | Hoang | |
| 2004/0079552 A1 | * | 4/2004 | Eddison | 175/61 |
| 2005/0035440 A1 | * | 2/2005 | Mohammed | 257/686 |
| 2005/0126022 A1 | * | 6/2005 | Hansberry et al. | 33/313 |
| 2007/0119630 A1 | * | 5/2007 | Hall et al. | 175/73 |
| 2008/0112143 A1 | | 5/2008 | Hanley | |

* cited by examiner

*Primary Examiner* — Tuan T Dinh
*Assistant Examiner* — Steven Sawyer
(74) *Attorney, Agent, or Firm* — Brinks Hofer Gilson & Lione

(57) ABSTRACT

A downhole tool string component has a through-bore intermediate first and second tool joints adapted for connection to adjacent tool string components. An instrumentation package is disposed within an outer diameter of the component. The instrumentation package comprises a circuit board assembly. The circuit board assembly comprises alternating rigid and elastomeric layers. The rigid layers are in electrical communication with each other.

12 Claims, 7 Drawing Sheets

INSTRUMENTATION PACKAGE IN A DOWNHOLE TOOL STRING COMPONENT

BACKGROUND

Embodiments of the present invention are related to gaining access to data from a drill string, especially a drill string for oil, gas, and geothermal well exploration and production, and more particularly to an electrical assembly for use in downhole drilling string components. Information such as temperature, pressure, inclination, salinity, etc. is of great value while drilling and can save time and money.

U.S. patent application Ser. No. 11/590,229 to Hanley, which is herein incorporated by reference for all that it contains, discloses an electronic assembly for use in a downhole tool. The electronic assembly includes a damming boot deployed about at least one integrated circuit component on a circuit board. The damming boot is disposed to house the integrated circuit leads and solder joints in a substantially sealed cavity between the circuit board, the integrated circuit body, and an inner surface of the damming boot. The damming boot is also disposed to support the integrated circuit body and thereby improve the shock and vibration resistance of various electronic assemblies used in downhole tools. The damming boot also tends to improve the reworkability of downhole electronic assemblies.

U.S. Pat. No. 6,225,688 to Kim et al., which is herein incorporated by reference for all that it contains, discloses a stacked microelectronic assembly and its resulting structure. The stacked microelectronic structure includes a flexible substrate having a plurality of attachment sites, test contacts and conductive terminals, and including a wiring layer with leads extending to the attachment sites. The stacked microelectronic assembly includes a plurality of microelectronic elements assembled to the attachment sites and electrically interconnecting the microelectronic elements and the leads. The flexible substrate is folded so as to stack at least some of the microelectronic elements in substantially vertical alignment with one another to provide a stacked assembly with the conductive terminals exposed at the bottom end of the stack and the test contacts exposed at the top end of the stack. The assembly may be made using a dam and/or or a spacer to facilitate the folding process. Two stacked microelectronic assemblies may be stacked together by providing a first stacked assembly with a plurality of connection pads exposed at the top end and providing a second stacked assembly with a plurality of solder balls connected to the terminals at the bottom end. The first and second assemblies may be stacked by connecting the solder balls to the connection pads.

U.S. Pat. No. 7,167,373 to Hoang, which is herein incorporated by reference for all it contains, discloses a flexible circuit and a stiffener. The flexible circuit has first, second, and third portions. The first portion is folded on an upper surface of the third portion and has first contact elements attached to a first device. The second portion is folded on the first device and has second contact elements attached to a second device. The stiffener is attached to the upper surface of the third portion and located between the upper surface of the third portion and the first portion.

U.S. Pat. No. 7,158,384 to Huang, which is herein incorporated by reference for all that it contains, discloses a vibration reducing structure of an electronic device includes first and second housings, a printed circuit board, a first post and a second post. The first and second housings define a closed space there between. The printed circuit board is disposed within the space and having a heavy component mounted on a first surface thereof. The first post is arranged on the first housing and under the heavy component. The second post is arranged on the second housing and above the heavy component.

SUMMARY

A downhole tool string component has a through-bore between a first tool joint and a second tool, the tool joints adapted for connection to adjacent tool string components. An instrumentation package is disposed within an outer diameter of the downhole tool string component. The instrumentation package includes a circuit board assembly. The circuit board assembly has alternating rigid and elastomeric layers. The rigid layers are in electrical communication with each other.

The instrumentation package may be disposed within the through-bore. The circuit board assembly, disposed within the instrumentation package, may be aligned with a longitudinal central axis of the through-bore. The instrumentation package may be laterally centered within the through-bore, such that drilling mud is adapted to flow between the outer surface of the instrumentation package and the through-bore wall.

At least two rigid layers of the circuit board assembly may be in electrical communication with each through a flexible connector. The flexible connector may comprise a single or multi layer flexible printed circuit board. The flexible connector may be a polyimide material. The rigid layers and flexible connectors may be a rigid-flexible circuit board that has been folded and stacked up onto itself. The rigid layers may have stiffeners.

The circuit board assembly may be disposed within a removable housing. A first end of the circuit board assembly may have an electrical connector adapted to communicate with a first electrical device and a second end of the circuit board assembly may comprise another electrical connector adapted to communicate with a second electrical device. The elastomeric material may be injected into the circuit board assembly. The circuit board assembly may have at least one anti-settling element adapted to prevent at least two boards from contacting each other.

The circuit board assembly may control a steerable downhole assembly. The circuit board assembly may be a processing unit for downhole electrical devices. The circuit board assembly may be in communication with a drill string telemetry system. The circuit board assembly may receive power from a downhole power generation system. The circuit board assembly may be disposed within a through-bore wall. The circuit board assembly may be disposed within a pocket formed by a sleeve surrounding the through-bore. The circuit board assembly may comprise a tube running the entire length of the package such that drilling mud is adapted to flow within the package through the tube.

DETAILED DESCRIPTION

Figure 1:
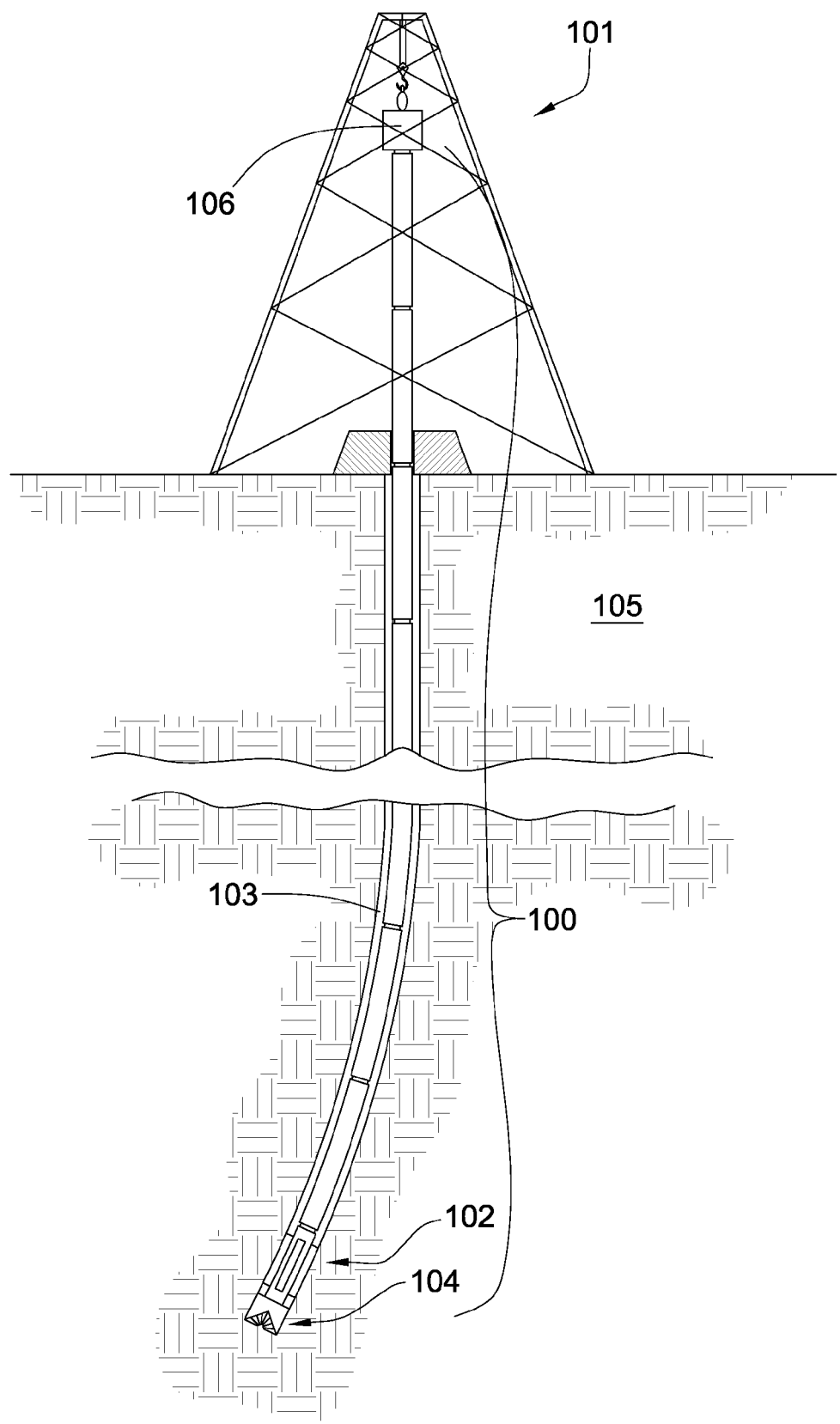
FIG. 1 is a cross sectional diagram of an embodiment of a drill string suspended in a wellbore.

FIG. 1 is a cross-section diagram of an embodiment of a drill string 100 suspended by a derrick 101. A bottom-hole assembly 102 is located at the bottom of a wellbore 103 and includes a drill bit 104. As the drill bit 104 rotates downhole the drill string 100 advances farther into the earth. The drill string 100 may penetrate soft or hard subterranean formations 105. The drill bit 104 may be adapted to steer the drill string 100 in a desired trajectory. Steering may be controlled by rotating a jack element (see FIG. 2) that is disposed at least partially within the drill bit 104 around a central axis of the jack element. The bottom-hole assembly 102 and/or downhole components may comprise data acquisition devices which may gather data. The data may be sent to the surface via a transmission system to a data swivel 106. The data swivel 106 may send the data to surface equipment (not shown). Further, the surface equipment may send data and/or power to downhole tools and/or the bottom-hole assembly 102. U.S. Pat. No. 6,670,880 which is herein incorporated by reference for all that it contains, discloses a telemetry system that may be compatible with embodiments of the present invention; however, other forms of telemetry may also be compatible such as systems that include mud pulse systems, electromagnetic waves, radio waves, and/or short hop. In some embodiments, no telemetry system is incorporated into the drill string.

Figure 2:
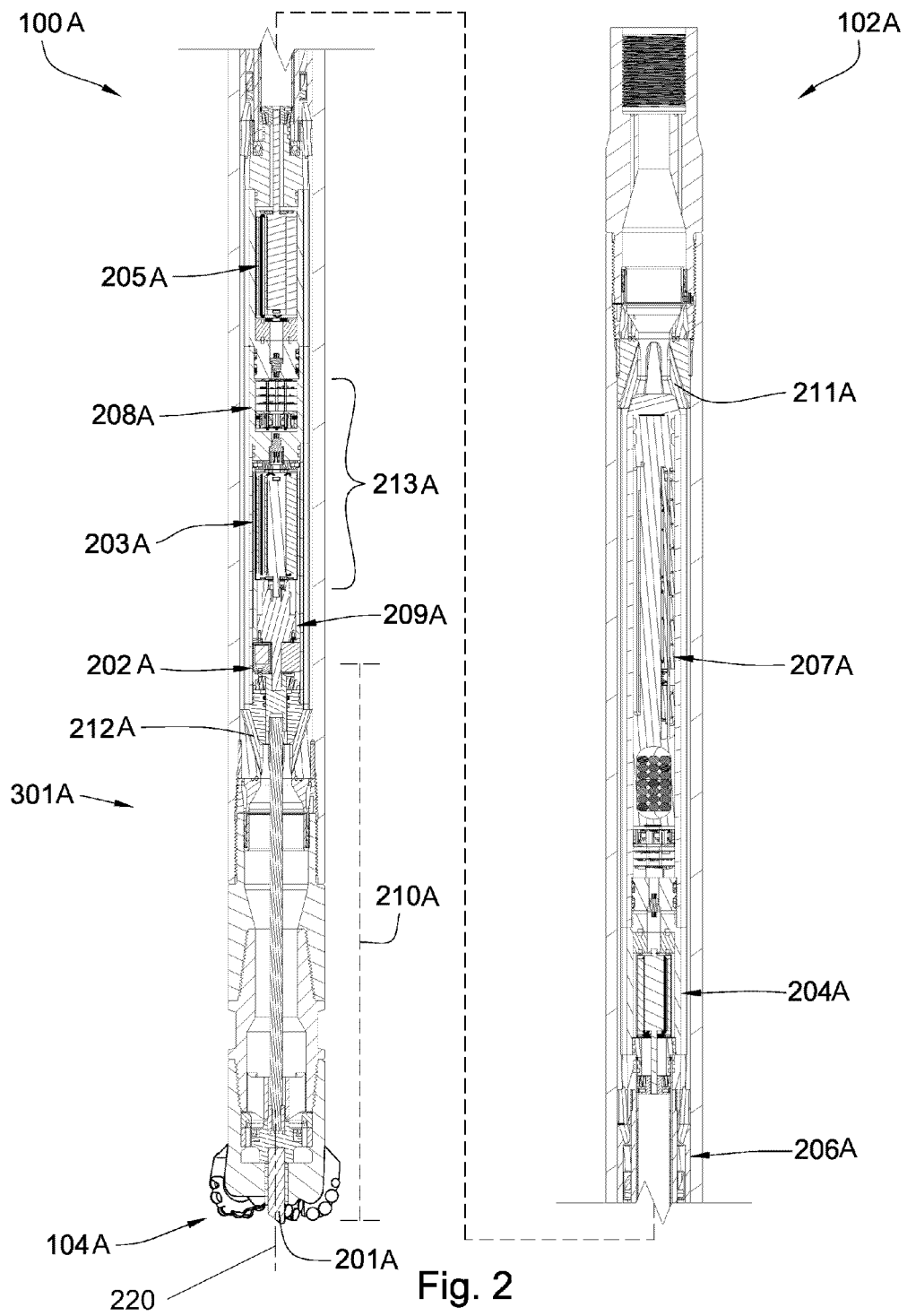
FIG. 2 is a cross sectional diagram of an embodiment of a downhole component.

Referring now to FIG. 2, a cross-sectional diagram of a drill string 100A discloses a bottom hole assembly (BHA) 102A including a drill bit 104A. The drill bit 104A may be part of the BHA 102A and include a jack element 201A. The jack element 201A may oscillate towards and away from the formation 105 of FIG. 1 and/or the jack element 201A may rotate around an axis 220. The drill string 100A may include an instrumentation package 213A. The instrumentation package 213A may include sensors, generators, circuit boards, processing units, or any other electronic device adapted for downhole operation. The drill string 100A may have at least one position feedback sensor 202A that is adapted to detect a position and/or orientation of the jack element 201A. Monitoring the position and/or orientation of the jack element 201A may aid in steering the drill string 100A. Rotation of the jack element 201A may be powered by a driving mechanism, such as a downhole motor 203A. The downhole motor 203A may be an electric motor, a mud motor, or combinations thereof. In the present embodiment, drill string 100A includes an upper generator 204A and a lower generator 205A. Both generators 204A, 205A are powered by the flow of drilling mud (not shown) past one or more turbines 206A disposed between the two generators 204A, 205A. Ports 211A, 212A within the drill string 100A may be adapted to divert drilling mud from an interior of a through bore to a channel within an inner wall of the through bore such that the drilling mud flows around components that are disposed within the interior of the through bore. In some embodiments only one generator may be used, or another method of powering the motor 203A may be employed.

The upper generator 204A may provide electricity to a direction and inclination (D&I) package 207A. D&I package 207A may monitor the orientation of the BHA 102A with respect to some relatively constant object, such as the center of the planet, the moon, the surface of the planet, a satellite, or combinations thereof. The lower generator 205A may provide electrical power to a circuit board assembly 208A and to the motor 203A. The circuit board assembly 208A may control steering and/or motor functions. The circuit board assembly 208A may receive drill string orientation information from the D&I package 207A and may alter the speed or direction of the motor 203A.

In the present embodiment a jack assembly 301A is disposed in a terminal region 210A of the drill string 100A and may be adapted to rotate with respect to the drill string 100A while the motor 203A may be rotationally fixed to the drill string 100A. In some embodiments one or more of the motor 203A, the generators 204A, 205A, the circuit board assembly 208A, the D&I package 207A, or some other electrical component, may be rotationally isolated from the drill string 100A. In the present embodiment the motor 203A connects to the jack element 201A via a gear train 209A. The gear train 209A may couple rotation of the motor 203A to rotation of the jack element 201A at a ratio of 25 rotations of the motor 203A to 1 rotation of the jack element 201A and may itself be rotationally fixed to the drill string 100A. In some embodiments a different ratio may be used. The gear train 209A and the jack element 201A may be part of the jack assembly 301A.

Figure 3:
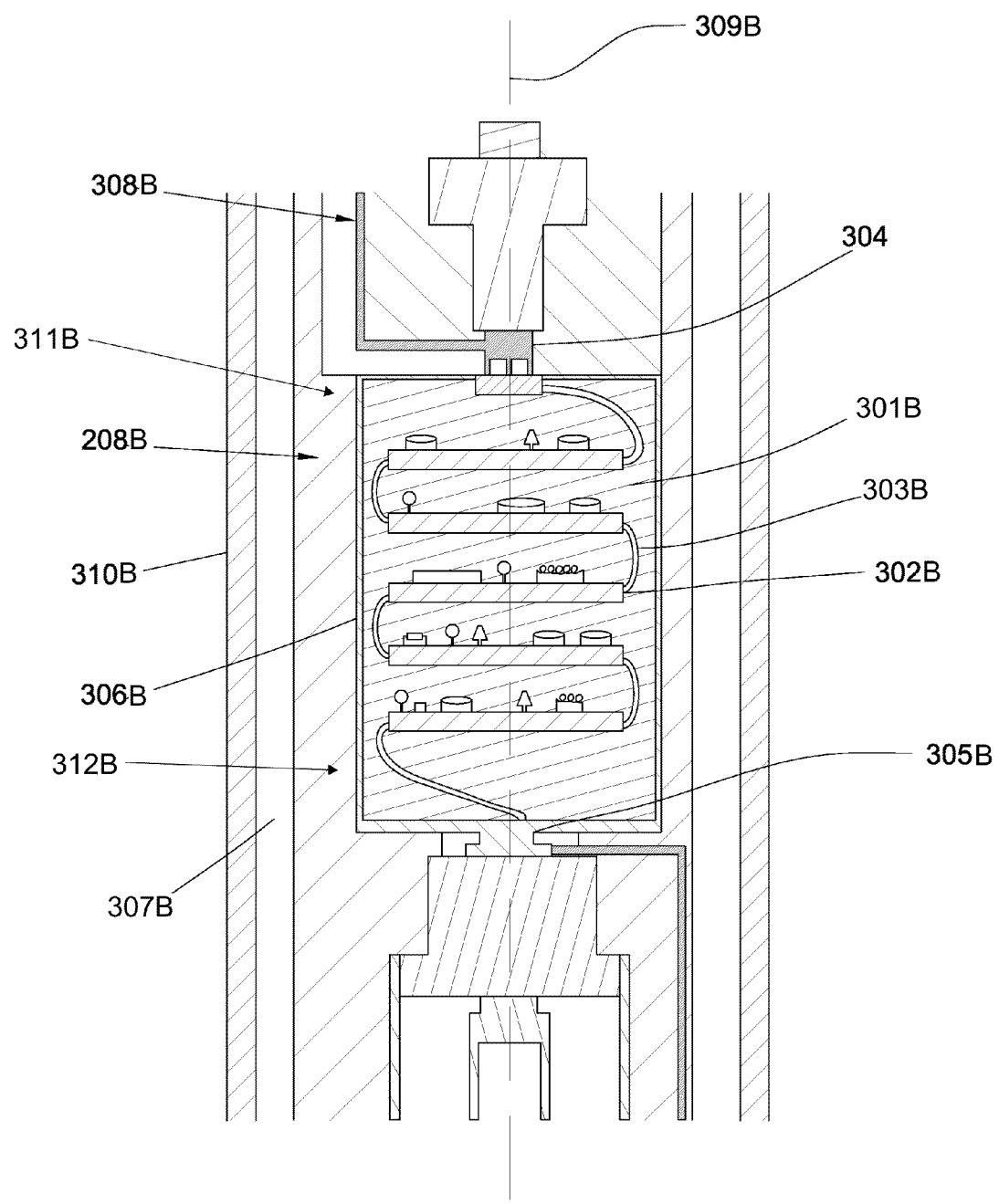
FIG. 3 is a cross sectional diagram of an embodiment of a circuit board assembly.

FIG. 3 is a cross sectional view of a diagram of an embodiment of a circuit board assembly 208B that may be aligned with a longitudinal central axis 309B of a through bore and may be laterally centered within the through bore. The circuit board assembly 208B may be disposed within a removable housing 306B. The removable housing 306B containing the circuit board assembly 208B may be disposed within the instrumentation package 213A of FIG. 2. The circuit board assembly 208B may be positioned such that drilling mud is adapted to flow in a channel 307B between a through bore wall 310B and an outer surface 308B of the removable housing 306B. It is believed that the drilling mud may act as a cooling agent as it flows around the circuit board assembly 208B.

The circuit board assembly 208B may include alternating rigid 302B and elastomeric layers 301B. The elastomeric layers 301B may be injected into the removable housing 306B such that the elastomeric layers 301B are dispersed between the rigid layers 302B. In some embodiments, the elastomeric layers 301B are connected together. The rigid layers 302B may be printed circuit boards. The printed circuit boards may be in communication with each other through a flexible connector 303B. The flexible connector 303B may be a single or multi-layer flexible printed circuit board. The rigid layers 302B in conjunction with the flexible connectors 303B may comprise a rigid-flexible circuit board that is stacked up on itself. Either the rigid layers 302B or the flexible connector 303B may be formed of a polyimide material. It is believed that due to higher temperature tolerances the polyimide material may provide better performance in a downhole environment. The elastomeric layers 301B may accommodate for downhole vibrations and shocks while the flexible connectors 303B maintain electrical communication. Vibrations may be induced from the rotary cutting action of a drill bit, firing of tool string jars and other downhole tools or combinations thereof.

A first end 311B of the circuit board assembly 208B may have an electrical connector 304B adapted to communicate with a first electrical device and a second end 312B of the circuit board assembly 208B may have another electrical connector 305B adapted to communicate with a second electrical device. The first and second electrical devices may together comprise a drill string telemetry system 308B. The circuit board assembly 208B may control the steerable downhole assembly 102 of FIG. 1. An example of a steerable downhole assembly that may be compatible with the present invention is disclosed in U.S. patent application Ser. No. 11/851,094 to Hall, which is herein incorporated by reference for all that it discloses. The circuit board assembly 208B may be a processing unit for downhole electrical devices. The circuit board assembly 208B may receive power from a power source such as downhole power generation systems 204, 205. An example of a downhole power generation system that may be compatible with the present invention is disclosed in U.S. patent application Ser. No. 11/940,091 to Hall, which is herein incorporated by reference for all that it discloses.

In some embodiment, the elastomeric layers 301B are also thermally conductive allowing immense heat from hot spots formed on the circuit boards to be spread quickly throughout the elastomeric layers 301B. In embodiments where the circuit board assembly 208B is located within the through bore of the downhole tool string component, the drilling mud may further absorb the heat as the drilling mud passes by. In some embodiments, the circuit board assemblies 208B may incorporate thermally conductive spurs which contact both the elastomeric layers 301B and the drilling mud directly.

Figure 4A:
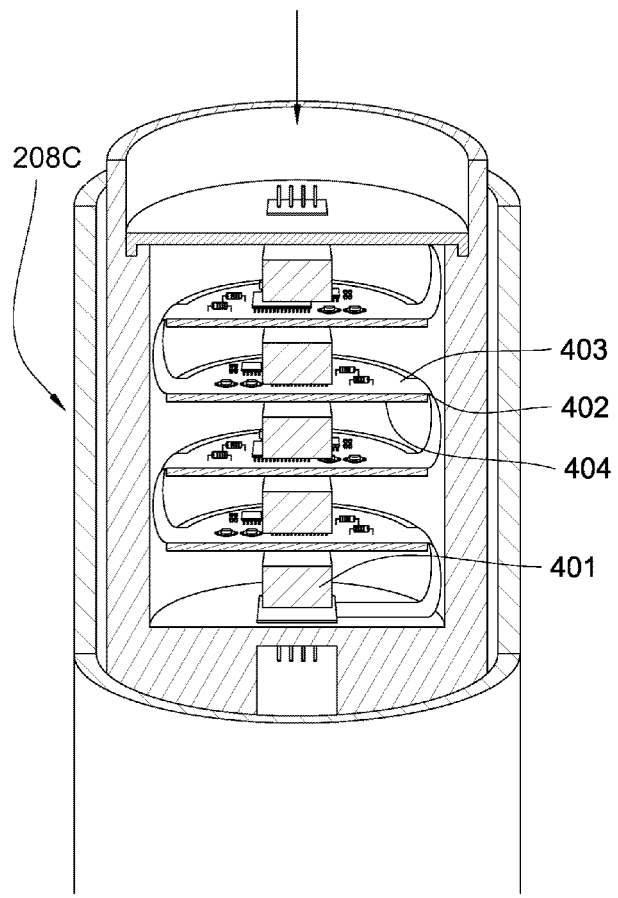
FIG. 4a is a cross sectional diagram of another embodiment of a circuit board assembly.

FIG. 4a is a cross sectional diagram of an embodiment of a circuit board assembly 208C. The elastomeric material (not shown) has been removed for illustration purposes. In FIG. 4a rigid layers may comprise a flexible printed circuit board 403 with stiffeners 404. The flexible printed circuit board 403 may also function as a connector 402. The embodiment depicted in FIG. 4a also discloses anti-settling devices 401 which may prevent the rigid layers 403 from contacting one another.

Figure 4B:
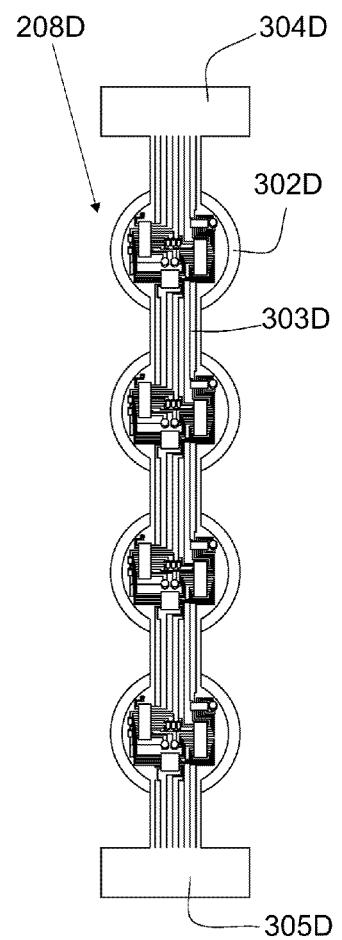
FIG. 4b is a extended diagram of another embodiment of a circuit board assembly.

FIG. 4b is an extended diagram of an embodiment of a circuit board assembly 208D. The circuit board assembly 208D may include stiffeners 302D. Connectors 303D may be formed of flexible printed circuit boards. The flexible printed circuit board may have a first connector 304D at first end of the circuit board assembly 208D and a second connector 305D a second end of the circuit board assembly 208D.

Figure 5:
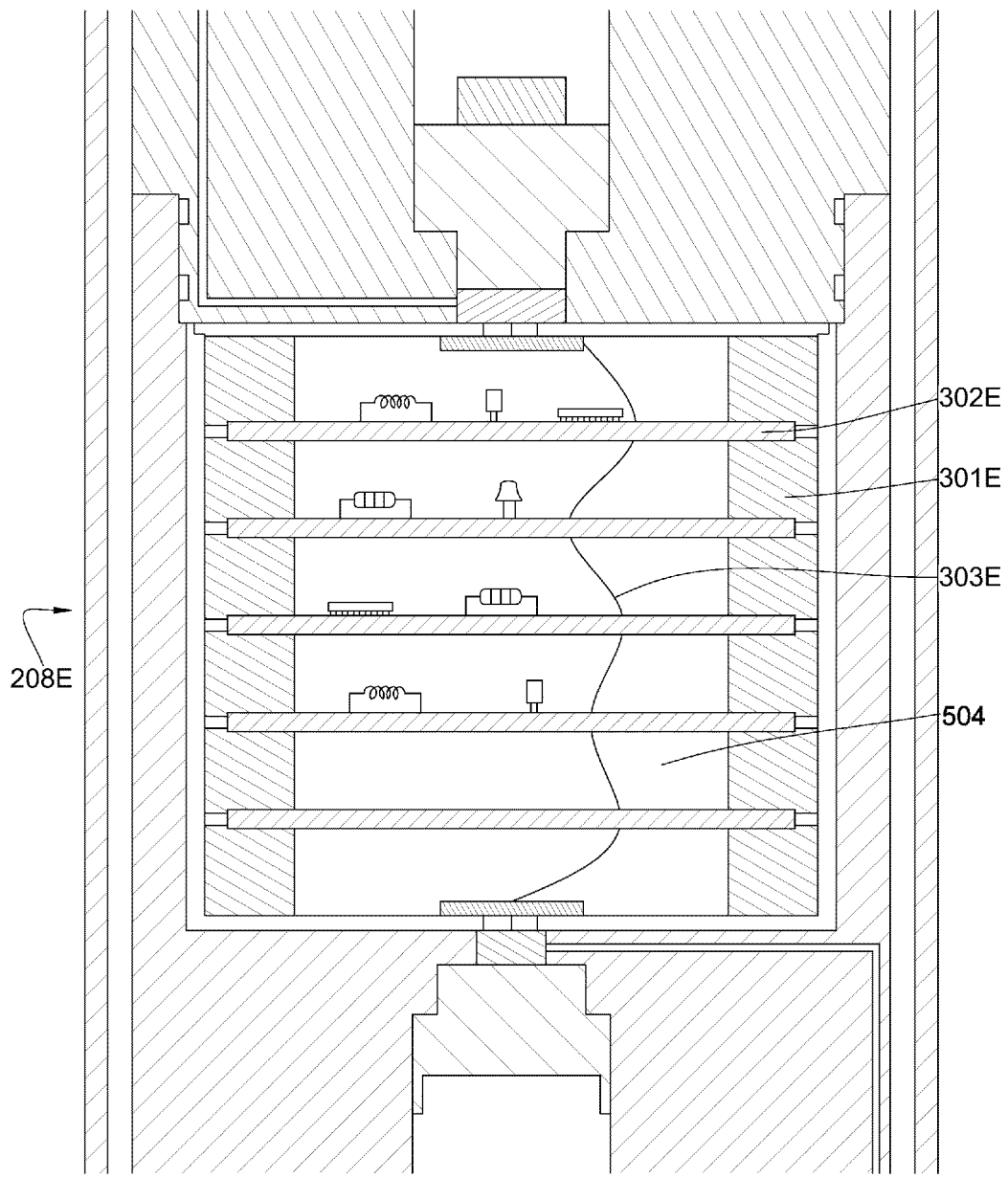
FIG. 5 is a cross sectional diagram of another embodiment of a circuit board assembly.

FIG. 5 is a diagram of another embodiment of a circuit board assembly 208E. In the embodiment depicted in FIG. 5 elastomeric layers 301E may be in the shape of rings such that they contact the rigid layer 302E on the outer edges. This may create a cavity 504 between each rigid layer 302E. Flexible connectors 303E may connect the rigid layers 302E through this cavity 504.

Figure 6A:
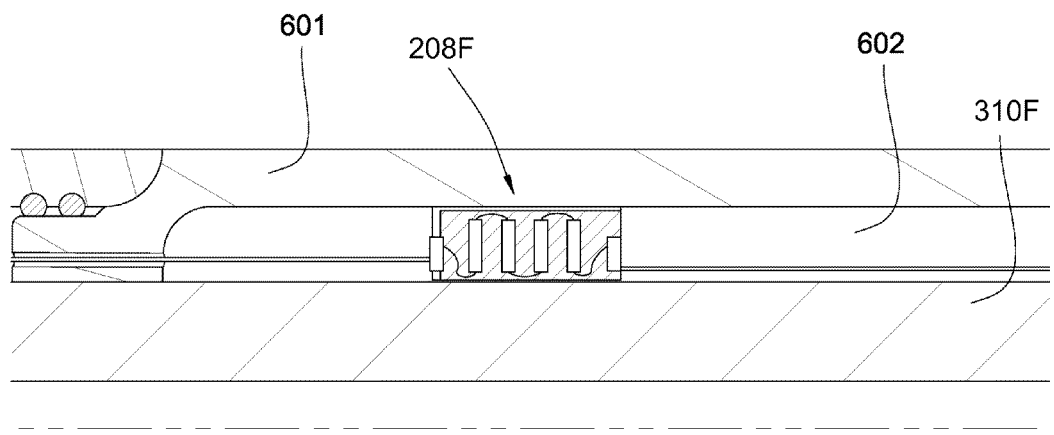
FIG. 6*a* is a cross sectional diagram of another embodiment of a circuit board assembly.
Figure 6B:
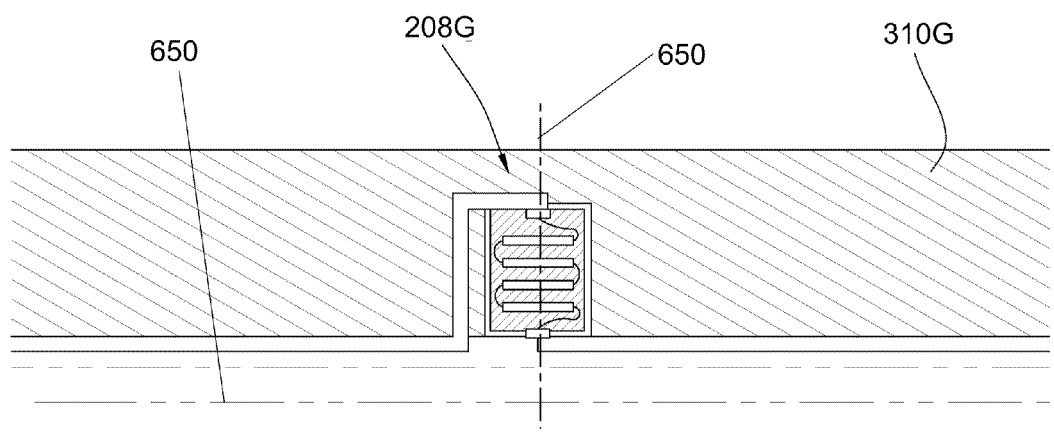
FIG. 6*b* is a cross sectional diagram of another embodiment of a circuit board assembly.

FIGS. 6a and 6b both are diagrams of two different embodiments of a circuit board assembly. In FIG. 6a a circuit board assembly 208F is disposed within a pocket 602 formed between a sleeve 601 and an outer surface of a through-bore wall 310F. An example of a pocket formed in a sleeve that may be compatible with the present invention is disclosed in U.S. patent application Ser. No. 11/688,952 by Hall et al which is herein incorporated by reference for all that it discloses.

The embodiment of FIG. 6b depicts a circuit board assembly 208G disposed with a through-bore wall 310G. A vertical axis 650 of the circuit board assembly 208G may be perpendicularly aligned with a longitudinal axis 650 of the through bore.

Figure 7:
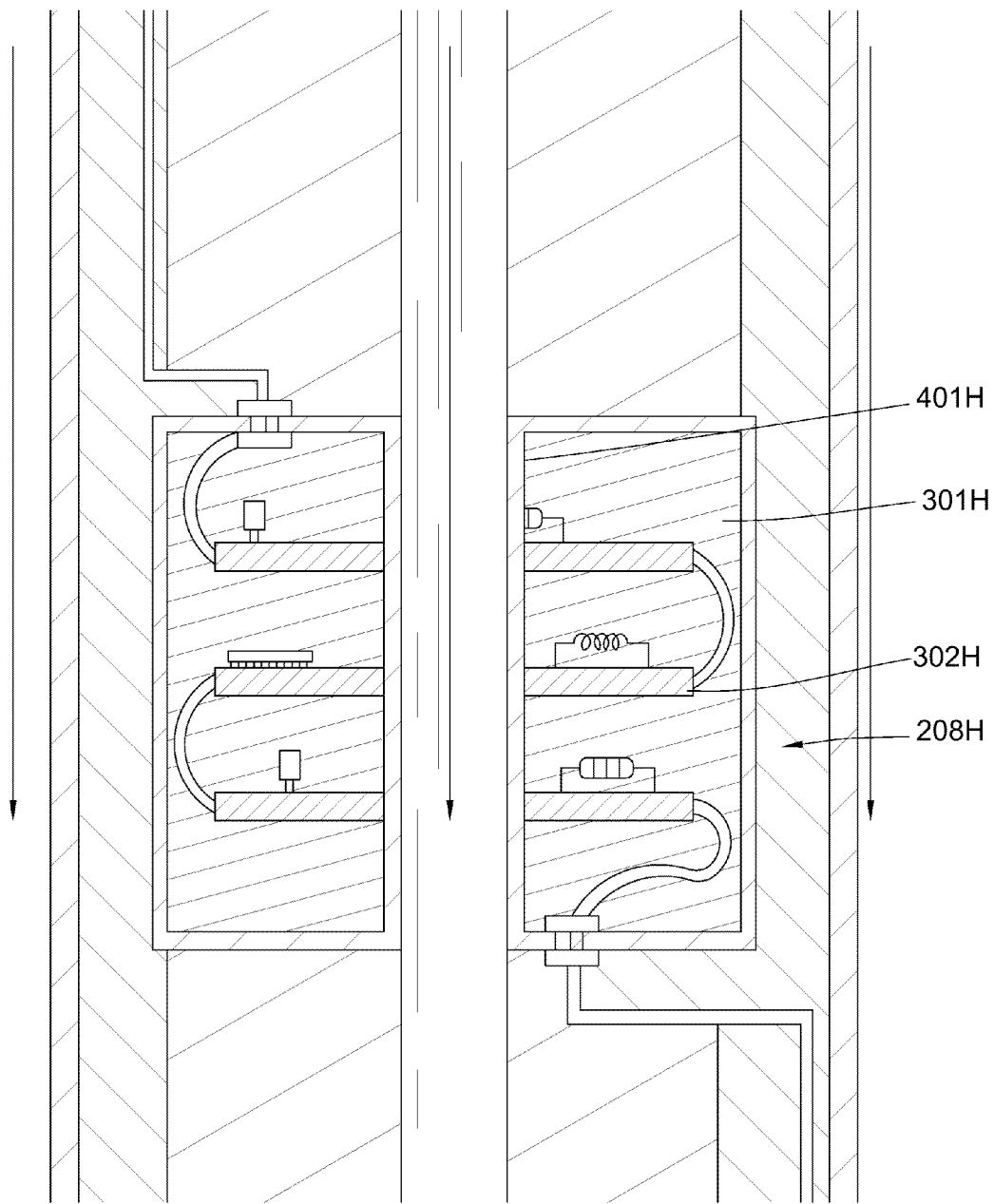
FIG. 7 is a cross sectional diagram of another embodiment of a circuit board assembly.

FIG. 7 is a diagram of an embodiment of a circuit board assembly 208H. The circuit board assembly 208H may have a tube 401H running the entire length of the circuit board assembly 208H such that drilling mud is adapted to flow through the circuit board assembly 208H within the tube 401H. The rigid 302H and elastomeric 301H layers may be formed such that they have a circle cut out of their approximate centers thereby providing a path for the tube 401H to travel through the circuit board assembly 208H. The drilling mud accommodated by the tube 401H may cool the circuit board assembly 208H as it passes through. The tube 401H may also provide additional lateral stability to the circuit board assembly 208H.

Whereas the present invention has been described in particular relation to the drawings attached hereto, it should be understood that other and further modifications apart from those shown or suggested herein, may be made within the scope and spirit of the present invention.

What is claimed is:

1. A downhole tool string component, comprising:
    a body having a first end, a second end, and an annular wall having an inner surface, said first end adapted for connection to a first adjacent tool string component, said second end adapted for connection to a second tool string component, and said inner surface having an annular pocket formed therein and defining a bore having an axis;
    an instrumentation package disposed at least partially within the annular pocket formed in the inner surface, said instrumentation package including a circuit board assembly having a plurality of rigid layers positioned perpendicular to the axis and an elastomeric material supporting each of said plurality of rigid layers, said elastomeric material being dispersed between each of said rigid layers and encapsulating each rigid layer, said plurality of rigid layers being in electrical communication with each other, and said circuit board assembly having a circular cutout; and
    a tube disposed within said circular cutout and running the length of the circuit board assembly.

2. The component of claim 1, wherein a first rigid layer of said plurality of rigid layers is in electrical communication with a second rigid layer of said plurality of rigid layers through a flexible connector.

3. The component of claim 1, wherein said circuit board assembly includes a rigid-flexible circuit board having alternating rigid sections and flexible sections configured to fold at said flexible sections to configure a stacked circuit board assembly.

4. The component of claim 1, further comprising a removable housing disposed in the pocket, wherein said circuit board assembly is disposed within said removable housing.

5. The component of claim 1, wherein said circuit board assembly has a first circuit board end and a second circuit board end, said first circuit board end having a first electrical connector adapted to communicate with a first electrical device and said second circuit board end having a second electrical connector adapted to communicate with a second electrical device.

6. The component of claim 1, wherein said circuit board assembly is configured to electrically control a steerable downhole assembly.

7. The component of claim 1, wherein said circuit board assembly is a processing unit for downhole electrical devices.

8. The component of claim 1, wherein said circuit board assembly is adapted to communicate with a drill string telemetry system.

9. The component of claim 1, further comprising a downhole power generation system, wherein said circuit board assembly receives electrical power from said downhole power generation system.

10. The component of claim 1, wherein at least one rigid layer from among said plurality of rigid layers is a printed circuit board having stiffeners.

11. The component of claim 2, wherein said flexible connector includes a multi-layer flexible printed circuit board.

12. The component of claim 2, wherein said flexible connector includes a polyimide material.

* * * * *